(12) United States Patent
Bosco et al.

(10) Patent No.: US 7,216,051 B2
(45) Date of Patent: May 8, 2007

(54) POWER SHORT CIRCUIT TESTING OF AN ELECTRONICS ASSEMBLY EMPLOYING PRE-CHARACTERIZED POWER OFF RESISTANCE OF AN ELECTRONIC COMPONENT THEREOF FROM A POWER BOUNDARY

(75) Inventors: Frank E Bosco, Poughkeepsie, NY (US); Gerald J. Fahr, Wappingers Falls, NY (US); Raymond A. Longhi, Poughkeepsie, NY (US); Vincent P. Mulligan, Port Ewen, NY (US)

(73) Assignee: International Business Machines Corporation, Armonk, NY (US)

( * ) Notice: Subject to any disclaimer, the term of this patent is extended or adjusted under 35 U.S.C. 154(b) by 49 days.

(21) Appl. No.: 11/137,878

(22) Filed: May 26, 2005

(65) Prior Publication Data
US 2006/0271326 A1 Nov. 30, 2006

(51) Int. Cl.
- *G01R 27/28* (2006.01)
- *G01R 31/00* (2006.01)
- *G01R 31/14* (2006.01)
- *G06F 19/00* (2006.01)

(52) U.S. Cl. .................. 702/118; 324/500; 324/537; 324/549; 324/647

(58) Field of Classification Search ................. 702/118; 324/647, 500
See application file for complete search history.

(56) References Cited

U.S. PATENT DOCUMENTS

| | | | |
|---|---|---|---|
| 5,398,025 A | 3/1995 | Herman | 340/660 |
| 6,369,580 B1 | 4/2002 | Takashima et al. | 324/500 |
| 6,373,262 B1 | 4/2002 | Herring et al. | 324/647 |
| 6,781,400 B2 | 8/2004 | Nakata et al. | 324/765 |

*Primary Examiner*—John Barlow
*Assistant Examiner*—Sujoy Kundu
(74) *Attorney, Agent, or Firm*—Lily Neff, Esq.; Kevin P. Radigan, Esq.; Heslin Rothenberg Farley & Mesiti, P.C.

(57) ABSTRACT

A technique for testing an electronics assembly for a power short circuit is provided. The technique includes pre-characterizing power off resistance of an electronic component(s) of a first packaging level from at least one power boundary of the electronic component(s). The characterizing of the power off resistance occurs prior to placement of the electronic component(s) into an electronics assembly of a higher packaging level. The technique further includes determining actual power off resistance of the electronics component(s) after placement thereof into the electronics assembly, with the actual power off resistance being determined from the at least one power boundary. Thereafter, the actual power off resistance of the electronic component(s) in the electronics assembly is compared with the pre-characterized power off resistance of the at least one electronic component(s), and a determination is made therefrom whether a power short circuit exists within the electronics assembly.

20 Claims, 3 Drawing Sheets

POWER SHORT CIRCUIT TESTING OF AN ELECTRONICS ASSEMBLY EMPLOYING PRE-CHARACTERIZED POWER OFF RESISTANCE OF AN ELECTRONIC COMPONENT THEREOF FROM A POWER BOUNDARY

TECHNICAL FIELD OF THE INVENTION

The present invention relates in general to testing of electronic components, and more particularly, to the testing of an electronics assembly at a power boundary to determine whether a power short circuit exists at the boundary prior to full power on of the electronics assembly.

BACKGROUND OF THE INVENTION

In any electronics product with serviceable, pluggable electronic components, there is the chance that power pins (i.e., voltage pins) can be shorted to ground, or to other voltage levels, either during assembly of the electronic components into the electronics product, or subsequently during replacement of an electronic component. If a power short circuit exists, and power being supplied to the shorted electronic module is high enough, damage to other electronic components of the product can occur with power on of the product. Therefore, a technique for testing for power short circuits prior to applying operational power to an electronics product is needed. Such a technique could advantageously prevent damage from occurring, and save time and money during a repair process, in addition to significantly improving product availability as well as customer satisfaction.

SUMMARY OF THE INVENTION

The problem of determining whether a power short circuit exists at a power boundary of an electronics component after the component has been assembled into a higher packaging level, and before applying operational power to the assembly/component, is greatly hindered by the leakage current of the component. In cases of large computer processor components, this leakage current can exceed that of the short circuit to be detected. That is, the power off resistance of the electronic component can be less than the short circuit resistance, thereby hindering or even negating the ability to conventionally differentiate between a properly plugged electronic component and a power short circuit condition. This problem is even more acute when several electronic components are plugged in parallel at a power boundary of a higher level packaging assembly.

Thus, the shortcomings of the prior art are overcome and additional advantages are provided herein through the provision of a novel method of testing an electronics assembly for a power short circuit. This method includes: characterizing power off resistance of at least one electronic component of a first packaging level from at least one power boundary of the at least one electronic component, the characterizing of power off resistance occurring prior to placement of the at least one electronic component into an electronics assembly of a second, higher packaging level; determining actual power off resistance of the at least one electronic component after placement into the electronics assembly of the second, higher packaging level, the actual power off resistance being determined from the at least one power boundary of the at least one electronic component; and comparing actual power off resistance of the at least one electronic component in the electronics assembly with the prior characterized power off resistance of the at least one electronic component, and determining therefrom whether a power short circuit exists in the electronics assembly.

In enhanced aspects, the method further includes pre-characterizing power off resistance of the at least one electronic component from each power boundary of the at least one electronic component, and the determining includes determining actual power off resistance of the at least one electronic component after placement into the electronics assembly from each power boundary of the at least one electronic component, wherein values for the characterized power off resistance and the actual power off resistance are separately compared for each power boundary of the at least one electronic component and a determination is separately made whether a power short circuit exists for that power boundary of the electronics assembly.

In another aspect, N electronic components of the first packaging level are to be placed in the electronics assembly and powered in parallel, wherein $N \geq 2$, and the technique further includes ascertaining an equivalent resistance of the N electronic components to be powered in parallel from at least one power boundary thereof, and after placement into the electronics assembly, testing the N electronic components from the at least one power boundary to determine the actual power off resistance thereof, and wherein the comparing includes comparing the actual power off resistance of the N electronic components powered in parallel with an equivalent resistance ascertained from the characterized power off resistance of each electronic component of the N electronic components, and determining therefrom whether a power short circuit exists in the electronic assembly.

Apparatuses and computer program products corresponding to the above-summarized methods are also described and claimed herein.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

BEST MODE FOR CARRYING OUT THE INVENTION

Figure 1:
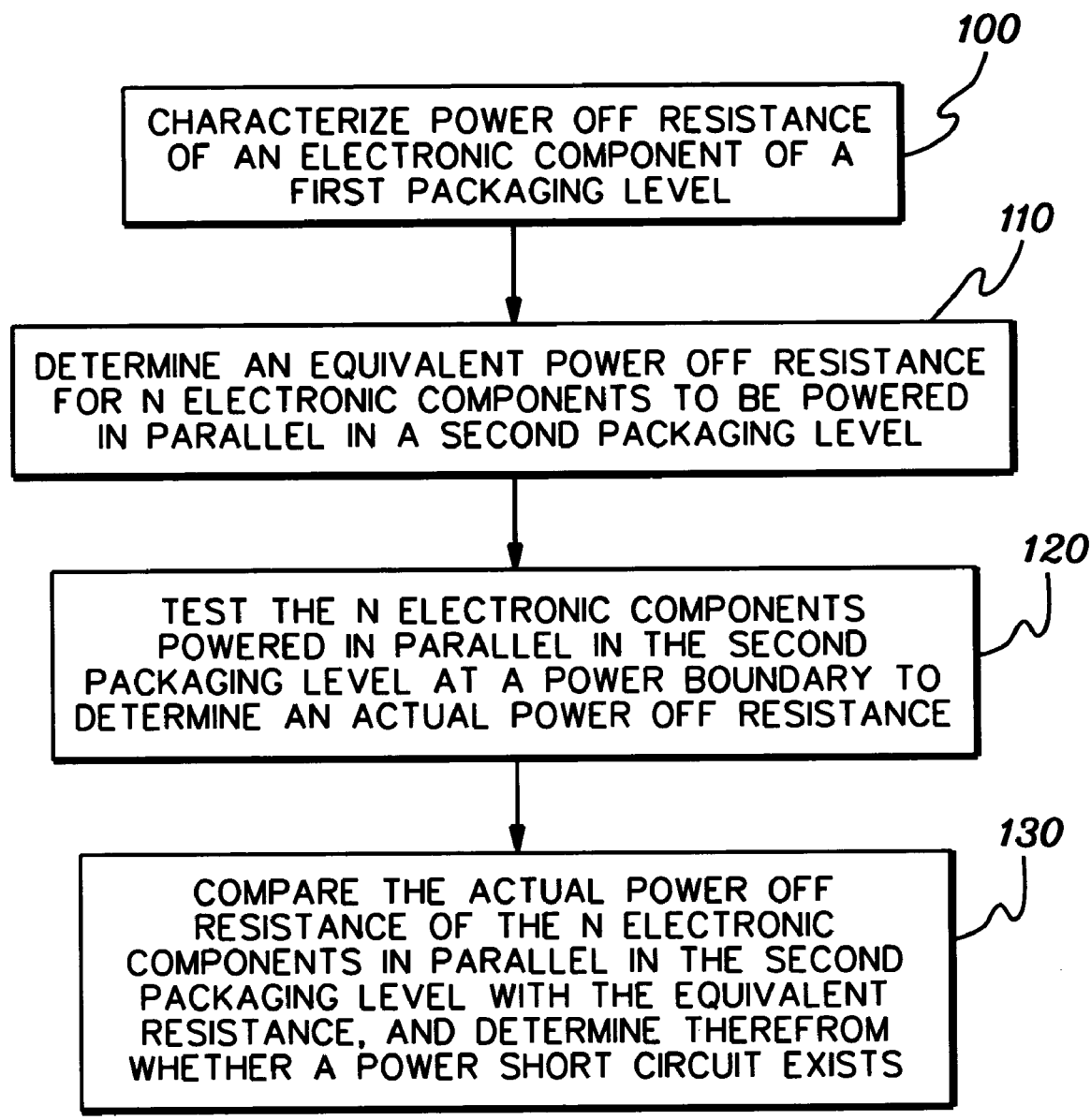
FIG. 1 is a flowchart of one process embodiment for determining whether a power short circuit exists in an electronics assembly having multiple electronic components placed therein, in accordance with an aspect of the present invention.

Generally stated, presented herein is an enhanced technique for testing an electronics assembly for power short circuits. The technique employs a prior characterization of power off resistance of electronic component(s) at a first packaging level prior to plugging of the component(s) into an electronic assembly of a second, higher packaging level. The power off resistance characterization is from one or more power boundaries of the electronic component(s). After characterizing resistance of the electronic component(s), the technique determines actual power off resistance of the electronic component(s) after assembly thereof into the electronics assembly of the second, higher packaging level. The actual power off resistance is again determined from the at least one power boundary of the electronics assembly/electronic component(s). Thereafter, the actual power off resistance is compared to the pre-characterized power off resistance, and a determination is made based thereon whether a power short circuit exists in the electronics assembly.

The concepts presented herein are applicable to any two levels of packaging, particularly where a component of one level is being placed or plugged into a larger assembly of a higher level. By way of example, the following discussion assumes that the electronic component is an electronic module, and that the electronic assembly is a board into which the electronic module is to be plugged. The concepts of the present invention, however, are readily applicable to any two packaging levels where a component (or subassembly) of one level is being placed into an assembly of another level and where there is a possibility for a power short circuit to arise on one or more of the power pins/planes of the higher level assembly, e.g., due to the component placement.

By pre-characterizing leakage current for each power level (or voltage level) on an electronic module before plugging the module into a board (and thereby characterizing resistance exhibited at a particular applied current on that level), the characterization information can be stored and used later when testing for a power short circuit in the board. If the power off resistance of a module is known for an applied current level on each power level of the module, then a power short circuit test can be performed on any and all power levels of the board, and a short circuit can be detected even when the power off resistance of the module is less than the resistance of the short circuit. Without the module resistance characterization, a power short circuit could only be detected if the resistance of the module is greater than that of the short circuit. This difference in limitation as to when a power short circuit can be detected illustrates a distinct advantage of using pre-characterization of a module, in accordance with an aspect of the present invention. The power short testing issue continues to become more important as module leakage currents keep increasing, making it more and more difficult to determine the existence of a power short circuit before applying full power to an electronic assembly, and potentially causing damage to the assembly. Further, the technique presented herein is even more beneficial when multiple electronic modules are plugged into a common board and share one or more power planes in parallel.

Figure 2:
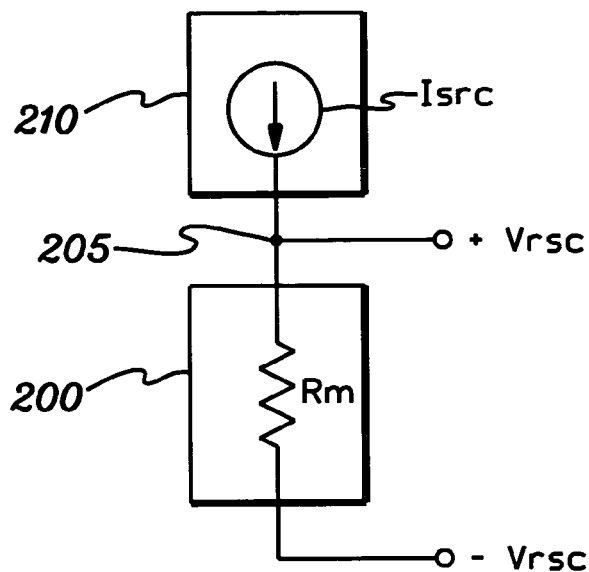
FIG. 2 is a block diagram illustration of an approach for characterizing power off resistance of an electronic component of a first packaging level from a power boundary thereof, in accordance with an aspect of the present invention.

Referring now to the drawings, FIG. 1 depicts one embodiment of power short test process in accordance with an aspect of the present invention. This process example assumes that N electronic components of a first packaging level are to be placed into and powered in parallel in an electronics assembly of a second packaging level, wherein N≧2. First, power off resistance of each electronic component of the first packaging level is characterized 100. As shown in FIG. 2, power off resistance (Rm) for an electronic component or module 200 can be determined at a power boundary (i.e., voltage level) 205 by applying a current source 210 set to a predetermined value (Isrc) to that power boundary, and measuring the voltage (Vsrc) generated on the boundary 205, and calculating the resultant resistance (Rm) therefrom. Thus, the power off resistance of the module's power boundary to be characterized can be expressed as set forth below in Equation 1:

$$Rm = Vsrc/Isrc \qquad (1)$$

The resulting power off resistance (Rm) is then stored for future use when performing a power short circuit test on an electronics assembly such as a card or board assembly which includes this module. Note that the applied current (Isrc) can be chosen so that the voltage (Vsrc) is readily measurable, and relatively linear over a surrounding range. The actual value of applied power to characterize the power off resistance (Rm) of the module 200 is only a small percentage of the intended operating power to the module at the boundary being tested, e.g., less than five percent. Also, note that module power off resistance could be pre-characterized during normal module testing.

Figure 3:
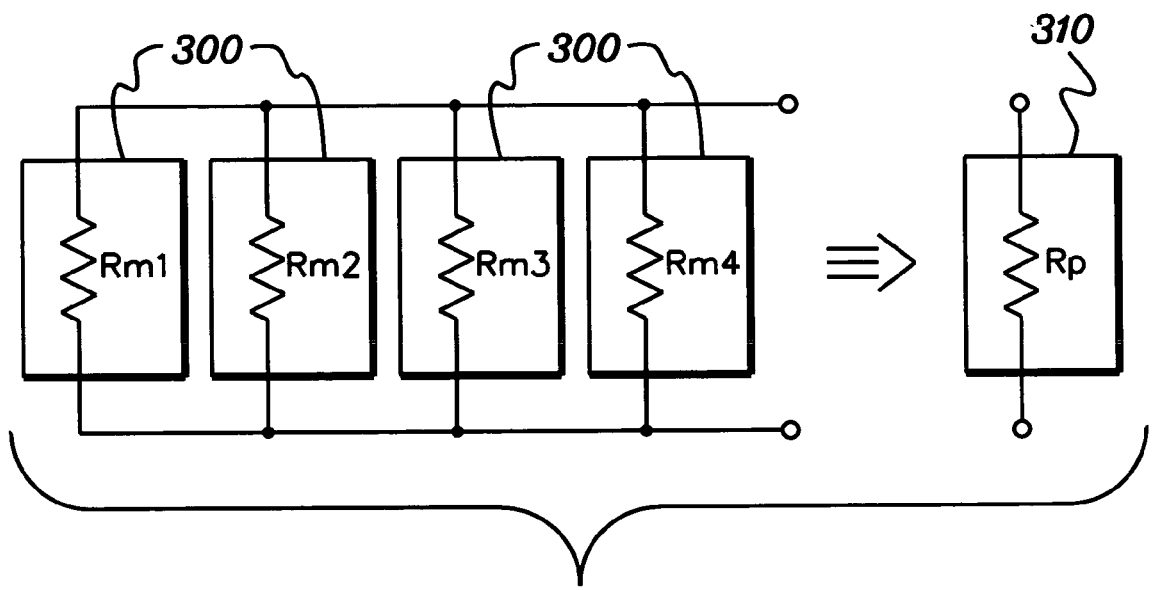
FIG. 3 is a block diagram illustration of multiple electronic components powered in parallel and an equivalent component subassembly representation with an equivalent power off resistance (Rp), in accordance with an aspect of the present invention.

Again, this example assumes that multiple (e.g., N≧2) electronic modules are to be powered in parallel in the higher level assembly. Thus, referring to FIG. 1, a next step is to ascertain an equivalent power off resistance for the N electronic components to be powered in parallel in the second packaging level 110. This is illustrated in FIG. 3, where, by way of example, four modules 300 are to be powered in parallel. Each module 300 has been pre-characterized, with its power off resistance (Rm1, Rm2, Rm3 & Rm4) having been determined and stored in accordance with step 100 of FIG. 1. The equivalent resistance for the N modules powered in parallel is assigned the variable (Rp) and the component combination is blocked together as a component subassembly 310 to be placed into the board. Stated generically, the equivalent power off resistance for N modules plugged into a common board assembly can be readily calculated using the stored, characterized power off resistance values for the individual components. This is expressed in Equation 2:

$$Rp = Rm1 // Rm2 // Rm3 \ldots // RmN \qquad (2)$$

Figure 4:
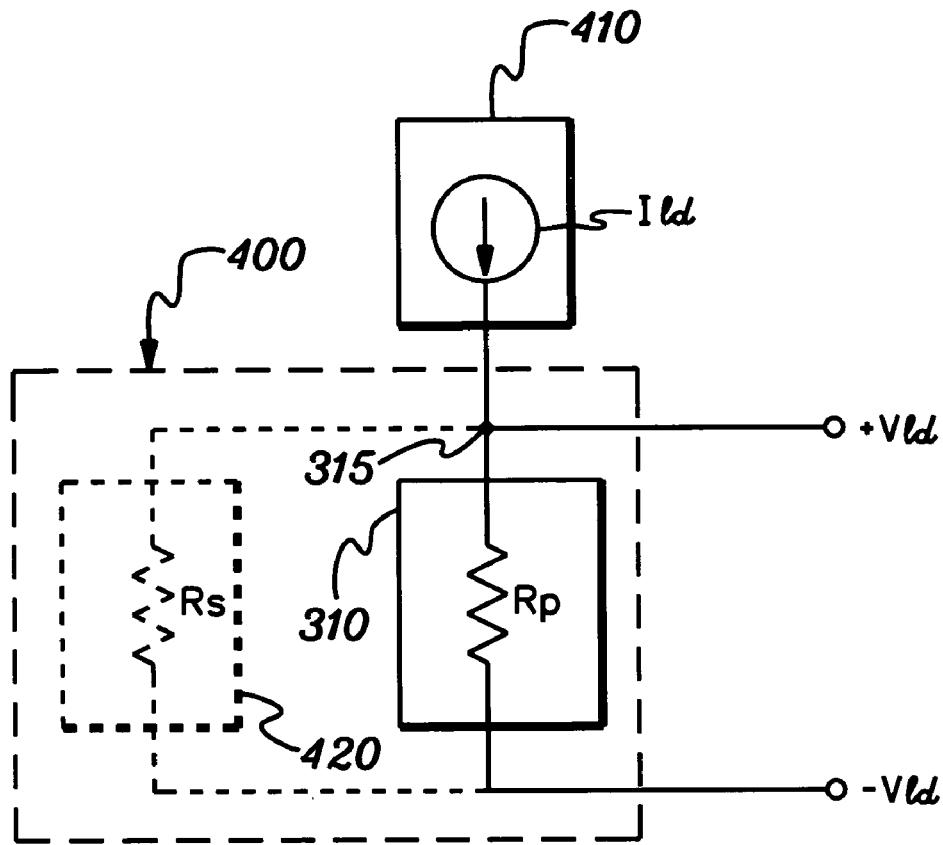
FIG. 4 is a block diagram illustration of an electronics assembly comprising the equivalent component subassembly representation of FIG. 3, and showing testing of the electronic components to determine an actual power off resistance (Rld) for the parallel powered components for comparison with the pre-characterized equivalent power off resistance (Rp) to determine whether a power short circuit exists, in accordance with an aspect of the present invention.

As noted in FIG. 1, the N electronic components powered in parallel in the electronics assembly of the second packaging level are next tested at the one or more power boundaries to determine actual power off resistances for the boundaries. As depicted in FIG. 4, this aspect of the power short circuit test can be performed by applying a current source (Ild) 410 to the desired power boundary 315 of the component subassembly 310 of the board assembly 400, measuring the resultant voltage on that boundary (Vld), and calculating the resulting actual power off resistance (Rld) on that boundary. This can be expressed as set forth in Equation 3:

$$Rld = Vld/Ild \qquad (3)$$

Ideally, the value of the applied current (Ild) is N times the characterization current (Isrc) employed in step 100 of FIG. 1, wherein N equals the number of characterized electronic components placed into the board which are powered in parallel from the boundary tested.

For each power boundary, the actual measured power off resistance of the N electronic components powered in parallel in the board is compared with the determined equivalent resistance, and based thereon at determination is made whether a power short circuit exists 130 (FIG. 1). For example, if the measured resistance (Rld) is equal to the equivalent resistance (Rp), then no short circuit is present. However, if the measured resistance (Rld) is less than the equivalent resistance (Rp), then a short circuit exists at the power boundary being tested. This is illustrated in FIG. 4 wherein a short circuit 420 is shown to be powered from the boundary 315 being tested, and thus is in parallel with the component subassembly 310 of board 400.

In practice, measurement error can also be taken into account during both the component characterization stage, and the short circuit testing stage of the assembly. This measurement error affects how much less a component resistance can be compared to a short circuit resistance (Rs) which can be detected. For example, since the equivalent resistance (Rp) and a short circuit resistance (Rs) would be in parallel at a given boundary (see FIG. 4), then with a 15% total measurement error, a power short circuit can still be detected even if the short circuit resistance (Rs) is five times larger than the equivalent module (Rp) resistance. That is, a detectable short in practice can be represented as:

$$Rs\ max < 5 \times Rp$$

In contrast with prior approaches, without component characterization a power short can only be detected if the short circuit resistance is less than the component resistance. Thus, there is a significant difference in the range of detectable short circuits between the prior approaches and the present invention. In accordance with the present invention, component pre-characterization of power off resistance allows for identification of a power short circuit even when the short circuit resistance is greater than the characterized power off resistance of the component. This is significant since component leakage currents continue to increase, making it more and more difficult to determine the existence of a power short circuit using conventional approaches before applying full power (and thus potentially causing damage to the assembly).

Figure 5:
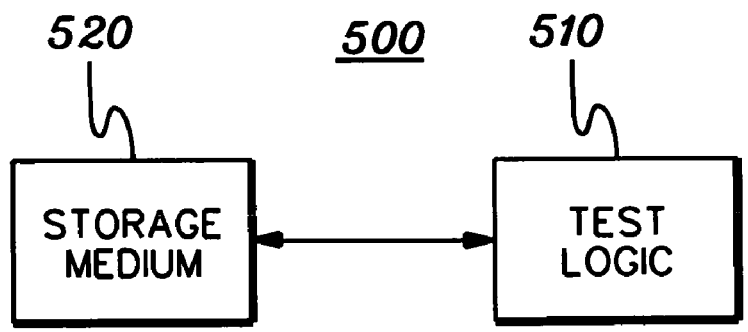
FIG. 5 is a block diagram illustration of one embodiment of an apparatus for characterizing an electronic component and/or testing an electronics assembly for a power short circuit, in accordance with an aspect of the present invention.

Pre-characterization and testing of power off resistance for one or more components can be performed employing various approaches. FIG. 5 depicts a simplified block diagram of characterization/test circuitry 500, which includes test logic 510 and a storage medium 520. This test circuitry may be external to a component or board being tested, or integrated onto the component or board as desired. Storage medium 520 is representative of any storage space required to hold the pre-characterized power off resistance values of the individual electronic components being placed into the higher level board assembly that are to be powered in parallel and to undergo power short circuit testing in accordance with the concepts of the present invention.

Those skilled in the art will further note from the above description, that it is possible to quantify the value of the short circuit resistance (Rs) given a known value of (Rp), the applied current (Ild) and measured voltage (Vld). Once the value of the short circuit resistance (Rs) is determined, a further determination can be made whether it is safe to power up the electronics assembly given the determined short circuit resistance. For example, if the short circuit resistance is significantly greater than the equivalent resistance (Rp), then it might be deemed safe to apply operational power to the board assembly notwithstanding the identification of the power short circuit.

The capabilities of one or more aspects of the present invention can be implemented in software, firmware, hardware or some combination thereof.

One or more aspects of the present invention can be included in an article of manufacture (e.g., one or more computer program products) having, for instance, computer usable media. The media has therein, for instance, computer readable program code means or logic (e.g., instructions, code, commands, etc.) to provide and facilitate the capabilities of the present invention. The article of manufacture can be included as a part of a computer system or sold separately.

Additionally, at least one program storage device readable by a machine embodying at least one program of instructions executable by the machine to perform the capabilities of the present invention can be provided.

The flow diagram depicted herein is just an example. There may be many variations to this diagram or the steps (or operations) described therein without departing from the spirit of the invention. For instance, certain steps may be performed in a differing order, or steps may be added, deleted or modified. All of these variations are considered a part of the claimed invention.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A method of testing an electronics assembly for a power short circuit, the method comprising:

characterizing power off resistance of at least one electronic component of a first packaging level from at least one power boundary of the at least one electronic component, the characterizing of power off resistance occurring prior to placement of the at least one electronic component into an electronics assembly of a second, higher packaging level;

determining actual power off resistance of the at least one electronic component after placement into the electronics assembly of the second, higher packaging level, the actual power off resistance being determined from the at least one power boundary of the at least one electronic component; and comparing actual power off resistance of the at least one electronic component in the electronics assembly with the prior characterized power off resistance of the at least one electronic component, and determining therefrom whether a power short circuit exists in the electronics assembly, if so, taking action to prevent potential damage to the electronics assembly resulting therefrom.

2. The method of claim 1, wherein the characterizing power off resistance further comprises applying a known current level to the at least one power boundary, measuring a voltage level at the at least one power boundary, and determining therefrom a power off resistance for the at least one electronic component.

3. The method of claim 1, further comprising characterizing power off resistance of the at least one electronic component from each power boundary of the at least one electronic component, and wherein the determining comprises determining actual power off resistance of the at least one electronic component after placement into the electronics assembly at each power boundary of the at least one electronic component.

4. The method of claim 1, wherein N electronic components of the first packaging level are to be placed into the electronics assembly of the second, higher packaging level and powered in parallel, $N \geq 2$, and wherein the characterizing further comprises ascertaining an equivalent resistance of the N electronic components to be powered in parallel from at least one power boundary thereof, and wherein the determining comprises testing the N electronic components in the electronics assembly from the at least one power boundary to determine the actual power off resistance thereof, and wherein the comparing comprises comparing the actual power off resistance of the N electronic components powered in parallel with the equivalent resistance ascertained for the N electronic components, and determining therefrom whether a power short circuit exists in the electronics assembly.

5. The method of claim 4, wherein a power short circuit exists if the actual power off resistance of the N electronic components powered in parallel in the electronics assembly is less than the ascertained equivalent power off resistance for the N electrical components of the first packaging level if powered in parallel.

6. The method of claim 4, wherein the ascertaining of the equivalent power off resistance for the N electronic components to be powered in parallel comprises characterizing power off resistance of each electronic component of the N electronic components, and calculating therefrom the equivalent power off resistance of the N electronic components from the at least one power boundary.

7. The method of claim 6, wherein the characterizing power off resistance of each electronic component comprises applying a known current level to the at least one power boundary, measuring a voltage level at the at least one power boundary, and determining therefrom a power off resistance for the electronic component, and wherein the determining of the actual power off resistance comprises applying a current level equal to approximately N times the known current level applied to each electronic component, measuring a voltage level at the at least one power boundary of the N electronic components powered in parallel in the electronics assembly, and determining therefrom the actual power off resistance for the N electronic components from the at least one power boundary.

8. The method of claim 1, wherein the determining whether a power short circuit exists comprises determining whether the actual power off resistance is less than at least one of the characterized power off resistance or a predefined percentage of the characterized power off resistance, and wherein a power short circuit is identifiable notwithstanding that resistance of the short circuit may be greater than the characterized power off resistance of the at least one electronic component.

9. The method of claim 1, further comprising storing the characterized power off resistance of the at least one electronic component for use during the comparing after placement of the at least one electronic component into the electronics assembly of the second, higher packaging level.

10. Apparatus for testing an electronics assembly for a power short circuit, the apparatus comprising:
   means for pre-characterizing power off resistance of at least one electronic component of a first packaging level from at least one power boundary of the at least one electronic component, the means for pre-characterizing comprising means for pre-characterizing power off resistance of the at least one electronic component prior to placement of the at least one electronic component into an electronics assembly of a second, higher packaging level;
   means for determining actual power off resistance of the at least one electronic component after placement into the electronics assembly of the second, higher packaging level, the actual power off resistance being determined from the at least one power boundary of the at least one electronic component; and
   means for comparing actual power off resistance of the at least one electronic component in the electronics assembly with the pre-characterized power off resistance of the at least one electronic component, and for determining therefrom whether a power short circuit exists in the electronics assembly, and if so, for taking action to prevent potential damage to the electronics assembly resulting therefrom.

11. The apparatus of claim 10, wherein the means for pre-characterizing power off resistance further comprises means for applying a known current level to the at least one power boundary, means for measuring a voltage level at the at least one power boundary, and means for determining therefrom a power off resistance for the at least one power boundary of the at least one electronic component.

12. The apparatus of claim 10, further comprising means for pre-characterizing power off resistance of the at least one electronic component from each power boundary of the at least one electronic component, and wherein the means for determining comprises means for determining actual power off resistance of the at least one electronic component after placement into the electronics assembly at each power boundary of the at least one electronic component.

13. The apparatus of claim 10, wherein N electronic components of the first packaging level are to be placed into the electronics assembly of the second, higher packaging level and powered in parallel, $N \geq 2$, and wherein the means for pre-characterizing further comprises means for ascertaining an equivalent resistance of the N electronic components to be powered in parallel from at least one power boundary thereof, and wherein the means for determining comprises means for testing the N electronic components in the electronics assembly from the at least one power boundary to determine the actual power off resistance thereof, and wherein the means for comparing comprises means for comparing the actual power off resistance of the N electronic components powered in parallel with the equivalent resistance ascertained for the N electronic components, and for determining therefrom whether a power short circuit exists in the electronics assembly.

14. The apparatus of claim 13, wherein a power short circuit exists if the actual power off resistance of the N electronic components powered in parallel in the electronics assembly is less than the ascertained equivalent power off resistance for the N electrical components of the first packaging level if powered in parallel.

15. The apparatus of claim 14, wherein the means for ascertaining of the equivalent power off resistance for the N electronic components to be powered in parallel comprises means for characterizing power off resistance of each electronic component of the N electronic components, and for calculating therefrom the equivalent power off resistance of the N electronic components from the at least one power boundary.

16. The apparatus of claim 15, wherein the means for characterizing power off resistance of each electronic component comprises means for applying a known current level to the at least one power boundary, means for measuring a voltage level at the at least one power boundary, and means for determining therefrom a power off resistance for the electronic component, and wherein the means for determining of the actual power off resistance comprises means for applying a current level equal to approximately N times the known current level applied to each electronic component, means for measuring a voltage level at the at least one power boundary of the N electronic components powered in parallel in the electronics assembly, and means for determining therefrom the actual power off resistance for the N electronic components from the at least one power boundary.

17. The apparatus of claim 10, wherein the means for determining whether a power short circuit exists comprises means for determining whether the actual power off resistance is less than at least one of the characterized power off resistance or a predefined percentage of the characterized power off resistance, and wherein a power short circuit is identifiable notwithstanding that resistance of the short circuit may be greater than the characterized power off resistance of the at least one electronic component.

18. The apparatus of claim 10, further comprising means for storing the characterized power off resistance of the at least one electronic component for use by the means for comparing after placement of the at least one electronic component into the electronics assembly of the second, higher packaging level.

19. At least one program storage device readable by a machine, tangibly embodying at least one program of instructions executable by the machine to perform a method of testing an electronics assembly for a power short circuit, the method comprising:

characterizing power off resistance of at least one electronic component of a first packaging level from at least one power boundary of the at least one electronic component, the characterizing of power off resistance occurring prior to placement of the at least one electronic component into an electronics assembly of a second, higher packaging level;

determining actual power off resistance of the at least one electronic component after placement into the electronics assembly of the second, higher packaging level, the actual power off resistance being determined from the at least one power boundary of the at least one electronic component; and comparing actual power off resistance of the at least one electronic component in the electronics assembly with the prior characterized power off resistance of the at least one electronic component, and determining therefrom whether a power short circuit exists in the electronics assembly, and if so, taking action to prevent potential damage to the electronics assembly resulting therefrom.

20. The at least one program storage device of claim 19, wherein the determining whether a power short circuit exists comprises determining whether the actual power off resistance is less than at least one of the characterized power resistance or a predefined percentage of the characterized power off resistance, and wherein a power short circuit is identifiable notwithstanding that resistance of the short circuit may be greater than the characterized power off resistance of the at least one electronic component.

* * * * *